(12) United States Patent
Masuda et al.

(10) Patent No.: US 6,734,725 B2
(45) Date of Patent: May 11, 2004

(54) POWER AMPLIFIER

(75) Inventors: Toshihiko Masuda, Tokyo (JP); Kazunobu Ohkuri, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/299,580

(22) Filed: Nov. 19, 2002

(65) Prior Publication Data

US 2003/0112064 A1 Jun. 19, 2003

(30) Foreign Application Priority Data

Nov. 19, 2001 (JP) ......................................... 2001-352923

(51) Int. Cl.⁷ ............................. H03F 3/38; H03F 3/217
(52) U.S. Cl. ......................................... 330/10; 330/251
(58) Field of Search ........................ 330/10, 251, 207 A (56) References Cited

U.S. PATENT DOCUMENTS 4,810,912 A * 3/1989 Theus et al. ................. 327/437
6,388,398 B1 * 5/2002 Li et al. ....................... 315/307

* cited by examiner

*Primary Examiner*—Patricia Nguyen
(74) *Attorney, Agent, or Firm*—Wolf, Greenfield & Sacks, P.C.

(57) ABSTRACT

A power amplifier circuit includes a pair of PWM circuits, to which an input signal is supplied, a pair of push-pull circuits, and drive circuits for supplying the outputs of the PWM circuits to the push-pull circuits as drive signals. A speaker is arranged between the output end of one push-pull circuit and the output end of the other push-pull circuit. The drive circuits alternately drive the respective push-pull circuits every cycle time of a PWM signal. The circuit can suppress radiation caused by the variation in output voltages.

7 Claims, 7 Drawing Sheets

POWER AMPLIFIER

BACKGROUND OF THE INVENTION

1. Field of the Invention

The present invention generally relates to power amplifiers and, more specifically, to a power amplifier for producing an output signal by conversion of an input signal into a pulse modulation signal and by power amplification.

2. Description of the Related Art

Class D amplifiers are known as power amplifiers for audio. Class D amplifiers amplify power by switching, each of which has a circuit configuration, for example, shown in FIG. 6.

Figure 6:
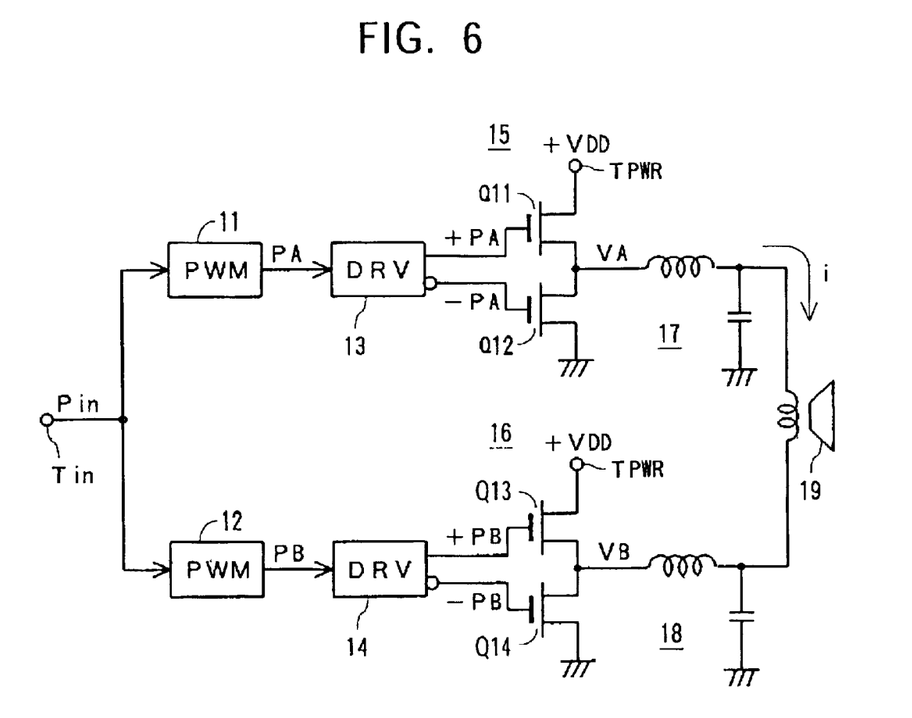
FIG. 6 is a circuit diagram of a class D power amplifier circuit.

In this circuit, an input digital audio signal Pin (hereinafter, referred to as "input signal Pin") is supplied through an input terminal Tin to pulse width modulation (PWM) circuits 11 and 12. The input signal Pin is converted into a pair of PWM signals PA and PB.

Figure 8:
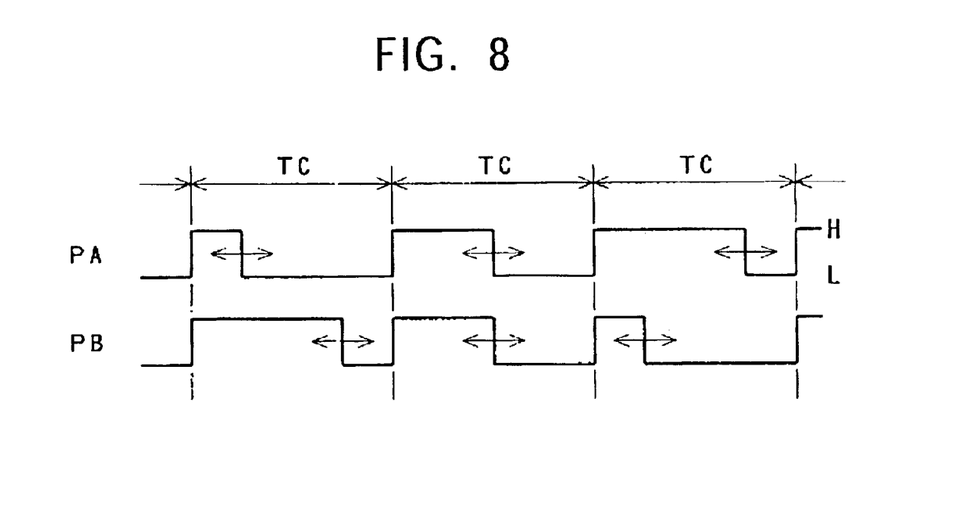
FIG. 8 includes graphs showing waveforms used for describing the circuit shown in FIG. 6.

The pulse duration of the PWM signals PA and PB varies in accordance with the level of the input signal Pin (the instantaneous level of the signal obtained by digital to analog conversion of the input signal Pin). However, as shown in FIG. 8, one PWM signal PA has a pulse duration corresponding to the level of the input signal Pin, and the other PWM signal PB has a pulse duration corresponding to the 2's complement of the level of the input signal Pin. The rise time of the PWM signals PA and PB is set to the start of one cycle time Tc of the PWM signals PA and PB, and the fall time of them varies in accordance with the level of the input signal Pin. In other words, the pulse duration of the PWM signal PA and that of the PWM signal PB always add up to one cycle time Tc in every period.

The carrier frequency fc (=1/Tc) of the PWM signals PA and PB is, for example, 16 times as large as the sampling frequency fs of the input signal Pin. The carrier frequency fc is calculated by the following equation, when fs is 48 kHz:

$$fc=16\ fs=16\times 48\ kHz=768\ kHz$$

Figure 7:
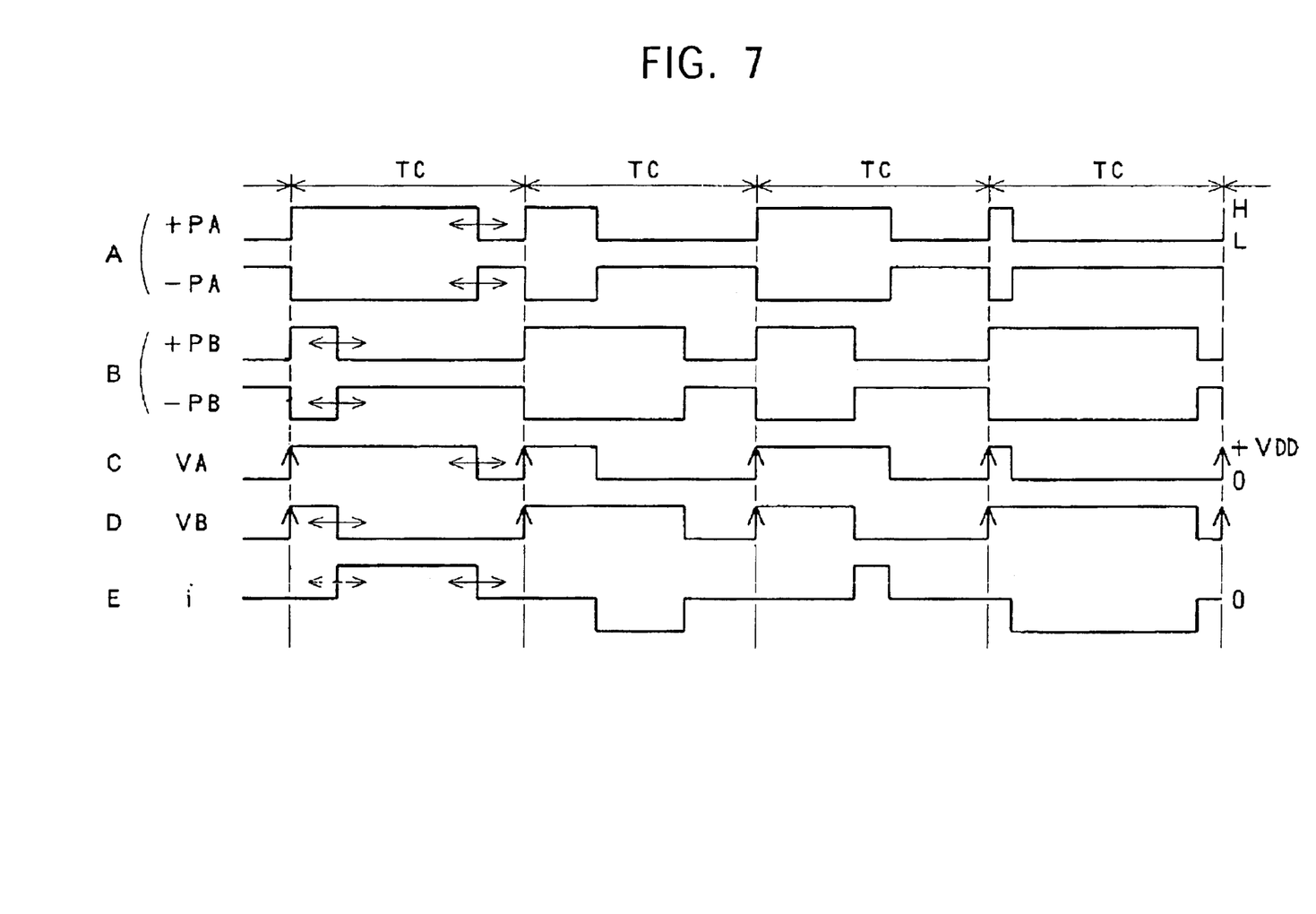
FIG. 7 includes graphs showing waveforms used for describing the circuit shown in FIG. 6.

One PWM signal PA is supplied to a drive circuit 13 to produce a pair of drive voltages +PA and −PA, which are shown in part A of FIG. 7. The drive voltage +PA has the same level as the signal PA, whereas the drive voltage −PA has the inverted level thereof. The drive voltages +PA and −PA are fed to the respective gates of a pair of switching elements, for example, N channel MOS FETs (metal oxide semiconductor field-effect transistors) Q11 and Q12.

In this case, the FETs Q11 and Q12 constitute a push-pull circuit 15, in which the drain of the FET Q11 is connected to a power terminal TPWR, while the source thereof is connected to the drain of the FET Q12. The source of the FET Q12 is grounded. A stable DC voltage +VDD of, for example, 20V to 50V is supplied as a power supply voltage to the power terminal TPWR.

Both the source of the FET Q11 and the drain of the FET Q12 are connected to one end of a speaker 19 through a low-pass filter 17 including a coil and a capacitor.

The other PWM signal PB is fed to the speaker 19 in the same manner as the PWM signal PA. Namely, the PWM signal PB is supplied to a drive circuit 14 to produce a pair of drive voltages +PB and −PB, which are shown in part B of FIG. 7. The drive voltage +PB has the same level as the signal PB, whereas the drive voltage −PB has the inverted level thereof. The drive voltages +PB and −PB are fed to the respective gates of a pair of N channel MOS FETs Q13 and Q14 constituting a push-pull circuit 16.

Both the source of the FET Q13 and the drain of the FET Q14 are connected to the other end of the speaker 19 through a low-pass filter 18 including a coil and a capacitor.

Referring to part C of FIG. 7, when +PA="H" and −PA="L", the FET Q11 switches ON, whereas the FET Q12 switches OFF. Thus, the voltage VA at the node between the FET Q11 and Q12 equals +VDD. In contrast, when +PA="L" and −PA="H", the FET Q11 switches OFF, whereas the FET Q12 switches ON, and therefore VA is equal to zero.

Similarly, referring to part D of FIG. 7, when +PB="H" and −PB="L", the FET Q13 switches ON, whereas the FET Q14 switches OFF. Thus, the voltage VB at the node between the FET Q13 and Q14 equals +VDD. In contrast, when +PB="L" and −PB="H", the FET Q13 switches OFF, whereas the FET Q14 switches ON, and therefore VB is equal to zero.

At VA=+VDD and VB=0, a current i flows from the node between the FETs Q11 and Q12 to the node between the FETs Q13 and Q14 through a line including the low-pass filter 17, the speaker 19, and the low-pass filter 18 in series, as shown in FIG. 6 and part E of FIG. 7.

At VA=0 and VB=+VDD, a reverse current i flows from the node between the FETs Q13 and Q14 to the node between the FETs Q11 and Q12 through a line including the low-pass filter 18, the speaker 19, and the low-pass filter 17 in series. In contrast, at VA=VB=+VDD and at VA=VB=0, no current i flows. That is, the push-pull circuits 15 and 16 constitute a BTL (Bridged-Tied Load) circuit.

The period during which the current i flows varies in accordance with the period during which the original PWM signals PA and PB rise. Also, the current i is integrated by the low-pass filters 17 and 18 when the current i flows through the speaker 19. As a result, the current i flowing through the speaker 19 is a power-amplified analog current corresponding to the level of the input signal Pin. That is, a power-amplified output is supplied to the speaker 19.

The circuit shown in FIG. 6 serves as a power amplifier. In this circuit, the FETs Q11 to Q14 amplify power by switching the power supply voltage +VDD in accordance with the input signal Pin, thereby achieving high efficiency and high power output.

Generally, the rise time and the fall time of pulse voltage cannot be completely zero. Also in the power amplifier described above, the rising edges and the falling edges of the drive voltages +PA and −PA are slightly inclined, for example, as shown in parts A and B of FIG. 9. In this situation, the FETs Q11 and Q12 turn on simultaneously, even transiently, during the rising edges and the falling edges of the drive voltages +PA and −PA, so that a short-through current flows through the FETs Q11 and Q12.

Figure 9:
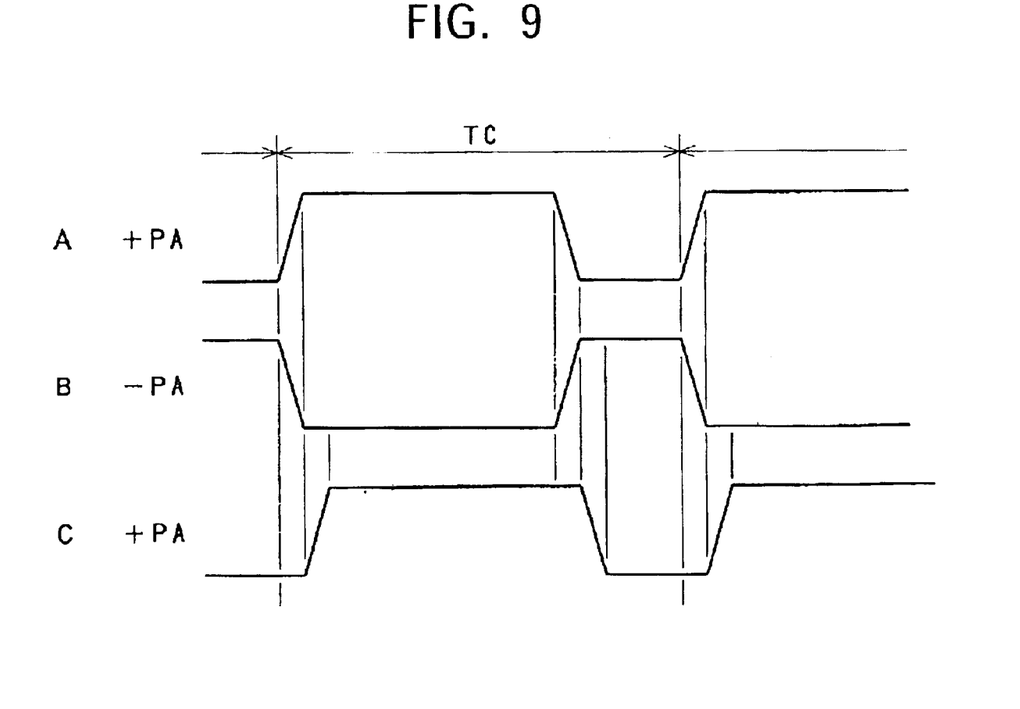
FIG. 9 includes graphs showing waveforms used for describing the circuit shown in FIG. 6.

Similarly, the FETs Q13 and Q14 turn on simultaneously, even transiently, during the rising edges and the falling edges of the drive voltages +PB and −PB, so that a short-through current flows through the FETs Q13 and Q14.

In a method for suppressing such a short-through current, as shown in parts B and C of FIG. 9, a time delay is caused between the edges of the drive voltage +PA and those of the drive voltage −PA attributable to the slight delay of the drive voltage +PA. In this case, the FETs Q11 and Q12 never turn on simultaneously, thereby suppressing a short-through current flowing through the FETs Q11 and Q12. A short-through current does not flow through the FETs Q13 and Q14, either.

However, with this method, the period during which output voltages VA and VB are +VDD is delayed, thus shortening the period during which the current i flows. As a result, the signal current supplied to the speaker 19 suffers distortion.

SUMMARY OF THE INVENTION

It is an object of the present invention to provide a power amplifier for suppressing a short-through current without varying the output current i.

A power amplifier of the present invention includes a first pulse modulation circuit for converting an input signal into a first pulse modulation signal indicating the level of the input signal and for outputting the first pulse modulation signal; a second pulse modulation circuit for converting the input signal into a second pulse modulation signal indicating the 2's complement of the level of the input signal and for outputting the second pulse modulation signal; a first output circuit and a second output circuit, each including a switching element; a first drive circuit for producing, from the output of the first pulse modulation circuit and the output of the second pulse modulation circuit, a first drive signal that drives the switching element of the first output circuit; and a second drive circuit for producing, from the output of the first pulse modulation circuit and the output of the second pulse modulation circuit, a second drive signal that drives the switching element of the second output circuit. A load is connected between the output end of the first output circuit and the output end of the second output circuit. The first drive circuit produces the first drive signal at odd-numbered periods of the first and second pulse modulation signals and produces an output value of zero at even-numbered periods of the first and second pulse modulation signals. The second drive circuit produces an output value of zero at odd-numbered periods of the first and second pulse modulation signals and produces the second drive signal at even-numbered periods of the first and second pulse modulation signals.

According to the present invention, since the numbers of rising edges and falling edges of the drive voltage of the switching element for output are ½ of the numbers of rising edges and falling edges of the PWM signal producing the drive voltage, a short-through current flowing through the switching element for output can be reduced by half, thereby decreasing power consumption loss. The decrease in power consumption loss can suppress heat generation in the switching element to reduce the required number of cooling devices such as heat sinks and also improve the space required by the power amplifier.

Furthermore, since the numbers of rising edges and falling edges of output voltages are ½ of the numbers of rising edges and falling edges of the PWM signal producing the output voltages, the radiation caused by the variation in the output voltages is reduced.

Thus, disturbance in the broadcast reception caused by the radiation can be suppressed, even when the power amplifier is integrated with a receiver or when it is arranged close to the receiver, such as in a car audio system. Such suppression can decrease the number of radiation shielding devices for the receiver, thus reducing the cost. Moreover, since the receiver can be arranged closer to the power amplifier, space saving can be achieved.

The above and other objects, features, and advantages of the present invention will become clear from the following description of the preferred embodiments taken in conjunction with the accompanying drawings.

DESCRIPTION OF THE PREFERRED EMBODIMENTS

Figure 1:
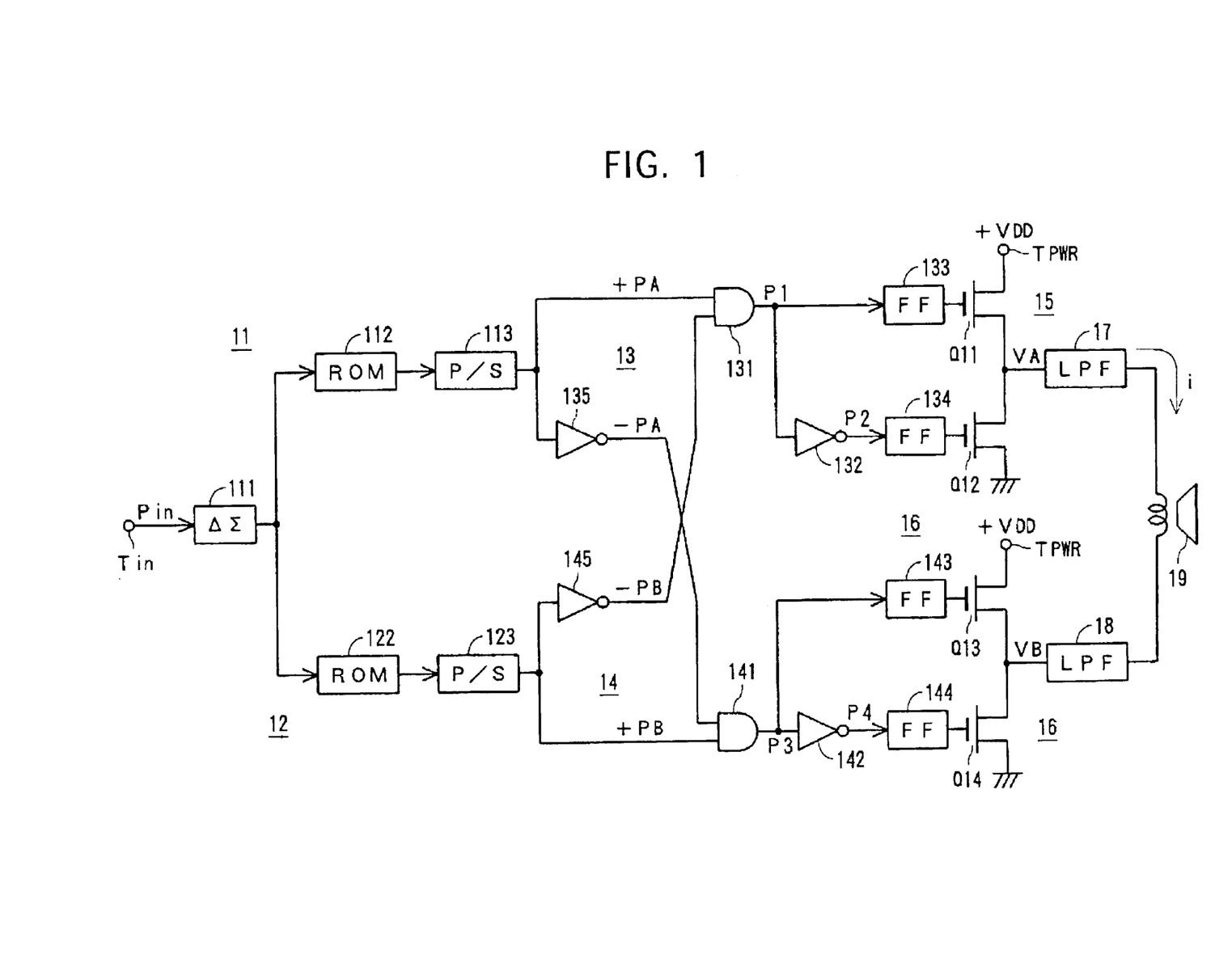
FIG. 1 is a circuit diagram of a power amplifier circuit according to an embodiment of the present invention.

FIG. 1 illustrates one example of a class D power amplifier according to an embodiment of the present invention. An input digital audio signal Pin is supplied to PWM circuits 11 and 12 through an input terminal Tin and is converted into, for example, PWM signals +PA and +PB, which are shown in parts A and B of FIG. 2.

In this power amplifier circuit, the pulse duration of the PWM signals +PA and +PB varies in accordance with the level of the input signal Pin. However, in the same manner as the PA and PB shown in FIG. 8, one PWM signal +PA has a pulse duration corresponding to the level of the input signal Pin, and the other PWM signal +PB has a pulse duration corresponding to the 2's complement of the level of the input signal Pin. The rise time of the PWM signals +PA and +PB is set to the start of one cycle time Tc thereof and the fall time of them varies in accordance with the level of the input signal Pin. Accordingly, the pulse duration of the PWM signal +PA and that of the PWM signal +PB always add up to one cycle time Tc in every period.

The carrier frequency fc (=1/Tc) of the PWM signals +PA and +PB is, for example, 16 times as large as the sampling frequency fs of the input signal Pin. The carrier frequency fc is calculated by the following equation, when fs is 48 kHz:

$$fc=16\ fs=16\times 48\ kHz=768\ kHz$$

In order to produce such a PWM signal +PA, the PWM circuit 11 has the following configuration: The input digital audio signal Pin is supplied to a ΔΣ modulation circuit 111 through the input terminal Tin and is converted into a digital audio signal having a reduced number of bits while suppressing quantization noise within the audible bandwidth, for example, it is converted into a digital audio signal having a quantized frequency (fc) of 16×fs and a quantization bit number of 6. This digital audio signal is supplied to a ROM 112 and then converted into parallel digital data corresponding to the quantization level thereof. The parallel digital data is supplied to a shift register 113 and converted therein into a serial signal, namely, the PWM signal +PA. In other words, a 6-bit digital audio signal is supplied as address data to the ROM 112. Thus, the ROM 112 stores 64 (=$2^6$) pieces of digital data corresponding to this address data.

In the PWM circuit 12, the digital audio signal outputted from the ΔΣ modulation circuit 111 is supplied to a ROM 122 and is then converted into parallel digital data corresponding to the 2's complement of the quantization level thereof. This parallel digital data is supplied to a shift register 123 and is converted therein into a serial signal, namely, the PWM signal +PB. Since the data structure of the ROM 122 is the same as that of the ROM 112, the 6-bit digital audio signal is supplied as address data to the ROM 122, which stores 64 (=$2^6$) pieces of digital data corresponding to this address data.

The ROM 112 and the ROM 122 may be integrated. Furthermore, the ROM 122 may have the following configuration: The ROM 122 stores an array of digital data that is the same as that of the ROM 112, and includes a translation table or a translation circuit for translating the supplied address data. The digital audio signal, which is supplied as the address data, is converted into the address data that stores the parallel digital data corresponding to the 2's complement of the level thereof, and the parallel digital data is outputted.

Then, the PWM signals +PA and +PB are supplied to drive circuits 13 and 14, respectively, to produce drive voltages P1 to P4. Namely, the PWM signal +PA is supplied to an AND circuit 131, and is also supplied to an inverter 135 to be inverted to the PWM signal—PA, which is shown in part A of FIG. 2. This PWM signal –PA is supplied to an AND circuit 141. The PWM signal +PB is supplied to the AND circuit 141, and is also supplied to an inverter 145 to be inverted to the PWM signal –PB, which is shown in part B of FIG. 2. This PWM signal –PB is supplied to the AND circuit 131. In this case, the voltage waveforms shown in parts A and B of FIG. 2 are the same as those shown in parts A and B of FIG. 7.

Figure 2:
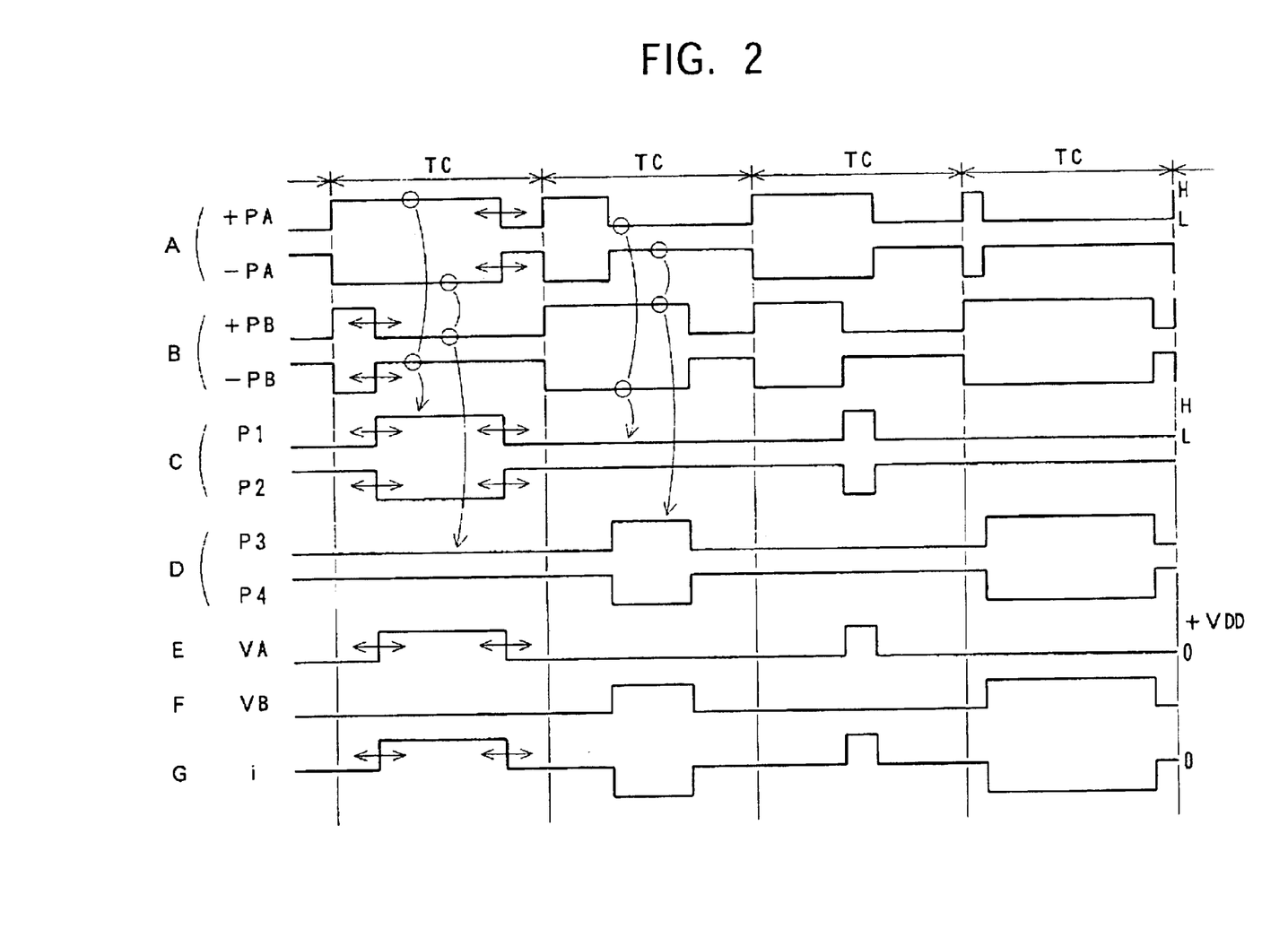
FIG. 2 includes graphs showing waveforms used for describing the circuit shown in FIG. 1.

Accordingly, the output voltage P1 of the AND circuit 131 becomes "H" when +PA="H" and –PB="H" and otherwise becomes "L", as shown in part C of FIG. 2. The output voltage P3 of the AND circuit 141 becomes "H" when –PA="H" and +PB="H" and otherwise becomes "L", as shown in part D of FIG. 2. These output voltages P1 and P3 are supplied to inverters 132 and 142, respectively, to produce the inverted output voltages P2 and P4 as shown in parts C and D of FIG. 2.

After these output voltages P1, P2, P3, and P4 are shaped in flip-flop circuits 133, 134, 143 and 144, the output voltages P1 and P2 are supplied as drive voltages to the respective gates of a pair of switching elements, for example, N channel MOS FETs Q11 and Q12.

In this case, the FETs Q11 and Q12 constitute a push-pull circuit 15, in which the drain of the FET Q11 is connected to a power terminal TPWR while the source of the FET Q11 is connected to the drain of the FET Q12. The source of the FET Q12 is grounded. Both the source of the FET Q11 and the drain of the FET Q12 are connected to one end of a speaker 19 through, for example, a low-pass filter 17 including a coil and a capacitor. A stable DC voltage +VDD of, for example, 20V to 50V is supplied as a power supply voltage to the power terminal TPWR.

The output voltages P3 and P4 are fed to the speaker 19 in the same manner as the output voltages P1 and P2. Namely, the output voltages P3 and P4 are supplied as drive voltages to the respective gates of a pair of N channel MOS FETs Q13 and Q14 constituting a push-pull circuit 16. Both the source of the FET Q13 and the drain of the FET Q14 are connected to the other end of the speaker 19 through a low-pass filter 18 including a coil and a capacitor.

With this configuration, when P1="H" and P2="L", the FET Q11 switches ON, whereas the FET Q12 switches OFF. Thus, the voltage VA at the node between the FET Q11 and Q12 equals +VDD, as shown in part E of FIG. 2. In contrast, when P1="L" and P2="H", the FET Q11 switches OFF, whereas the FET Q12 switches ON, and therefore VA is equal to zero.

Similarly, when P3="H" and P4="L", the FET Q13 switches ON, whereas the FET Q14 switches OFF. Thus, the voltage VB at the node between the FET Q13 and Q14 equals +VDD, as shown in part F of FIG. 7. In contrast, when P3="L" and P4="H", the FET Q13 switches OFF, whereas the FET Q14 switches ON, and therefore VB is equal to zero.

At VA=+VDD and VB=0, a current i flows from the node between the FETs Q11 and Q12 to the node between the FETs Q13 and Q14 through a line including the low-pass filter 17, the speaker 19, and the low-pass filter 18 in series as shown in FIG. 1 and part G of FIG. 2.

At VA=0 and VB=+VDD, a reverse current i flows from the node between the FETs Q13 and Q14 to the node between the FETs Q11 and Q12 through a line including the low-pass filter 18, the speaker 19, and the low-pass filter 17 in series. Furthermore, at VA=VB=+VDD and at VA=VB=0, no current i flows. That is, the push-pull circuits 15 and 16 constitute a BTL circuit.

The period during which the current i flows varies in accordance with the period during which the original PWM signals PA and PB rise. Furthermore, the current i is integrated by the low-pass filters 17 and 18 when the current i flows through the speaker 19. As a result, the current i flowing through the speaker 19 is a power-amplified analog current corresponding to the level of the input signal Pin. Thus, the circuit shown in FIG. 1 serves as a class D power amplifier and a power-amplified output is supplied to the speaker 19.

The voltage waveforms shown in parts A and B of FIG. 2 are the same as ones shown in part A and B of FIG. 7, and the current waveform shown in part G of FIG. 2 is the same as one shown in part E of FIG. 7. Accordingly, the power amplifier shown in FIG. 1 produces an output equivalent to that of the power amplifier shown in FIG. 6.

The power amplifier shown in FIG. 1 amplifies power by switching. As also shown in FIG. 2, when the period of the PWM signals +PA and +PB is Tc, the period of the drive voltages P1 to P4 is 2 Tc. In other words, the numbers of rising edges and falling edges of the drive voltages P1 to P4 are ½ of the numbers of rising edges and falling edges of the output voltages VA and VB (shown in parts C and D of FIG. 7) in the power amplifier shown in FIG. 6. Thus, a short-through current flowing through the FETs Q11 and Q12 and the FETs Q13 and Q14 can be reduced by half, thereby decreasing power consumption loss.

The decrease in power consumption loss can suppress heat generation in FETs Q11 to Q14 to reduce the required number of cooling devices such as heat sinks and also improve the space required by the power amplifier.

When the output voltages VA and VB vary, radiation that is caused at the rising edges and the falling edges thereof enters a receiver as noise, so that the broadcast reception is disturbed. However, since the numbers of rising edges and falling edges of the output voltages VA and VB shown in parts E and F of FIG. 2 are ½ of the numbers of rising edges and falling edges of the output voltages VA and VB in the power amplifier shown in FIG. 6, the radiation caused by the variation in the output voltages VA and VB is reduced.

Additionally, the frequencies of the output voltages VA and VB are ½ of those of the output voltages VA and VB in the power amplifier shown in FIG. 6. Thus, disturbance in the broadcast reception caused by the radiation can be suppressed, even when the power amplifier is integrated with the receiver or when it is arranged close to the receiver, such as in a car audio system. Such suppression can decrease the number of radiation shielding devices for the receiver, thus reducing the cost. Furthermore, since the receiver can be arranged closer to the power amplifier, space saving can be achieved.

Figure 3:
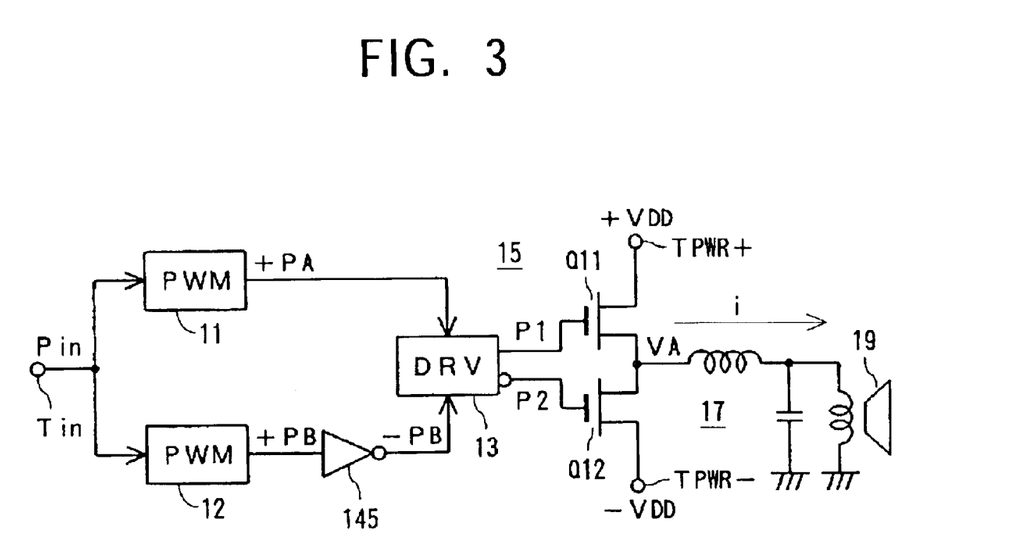
FIG. 3 is a circuit diagram of a power amplifier circuit according to another embodiment of the present invention.

Although the case where the output stage of the power amplifier is the BTL circuit has been described above, the output stage may be a single circuit, as shown in FIG. 3.

Figure 4:
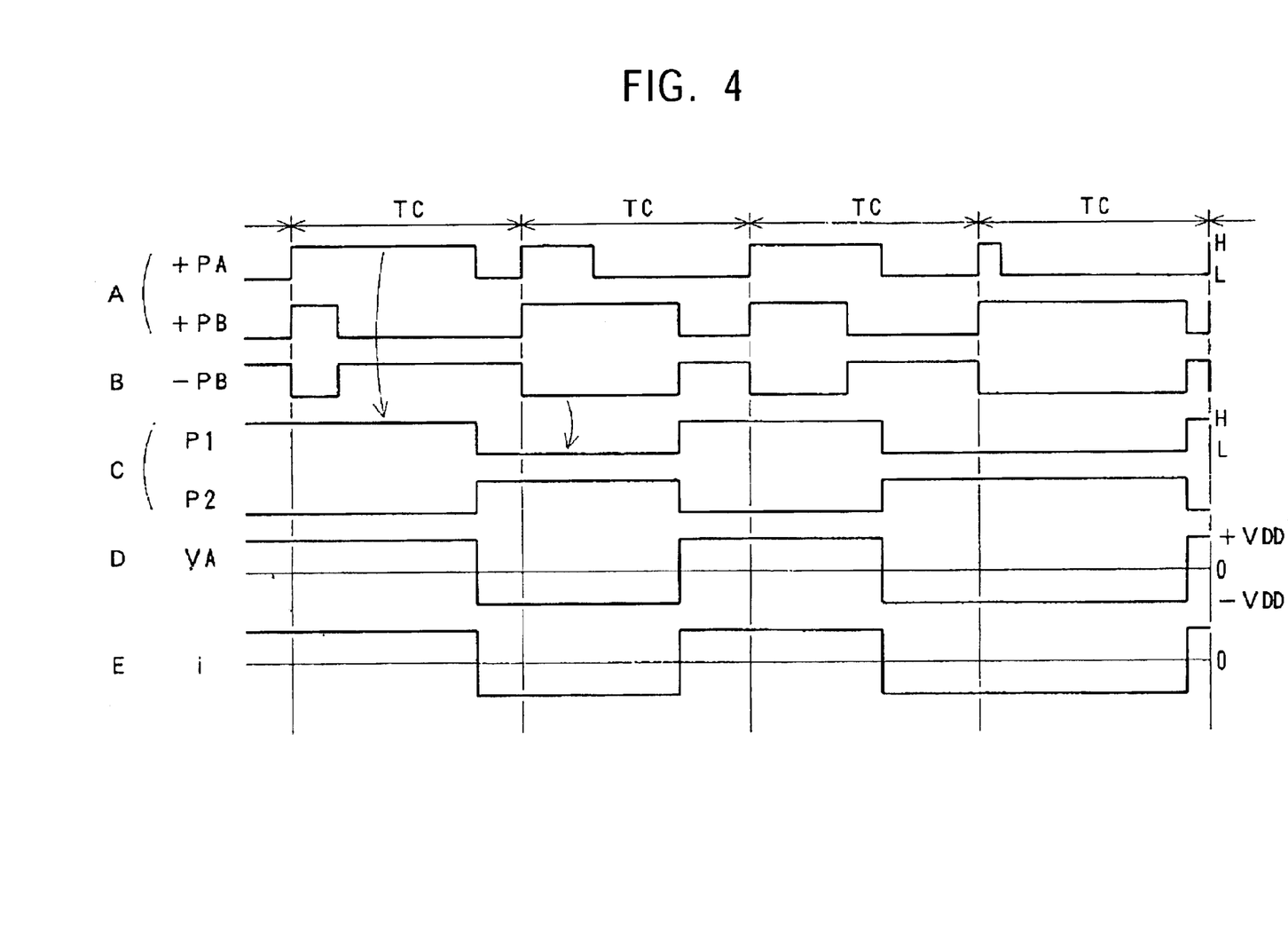
FIG. 4 includes graphs showing waveforms used for describing the circuit shown in FIG. 3.

PWM signals +PA and +PB shown in part A of FIG. 4 are outputted from PWM circuits 11 and 12 in the power amplifier shown in FIG. 3. Namely, one PWM signal +PA has a pulse duration corresponding to the level of an input signal Pin, and the other PWM signal +PB has a pulse duration corresponding to the 2's complement of the level of the input signal Pin. The rise time of the PWM signals +PA and +PB is set to the start of one cycle time Tc thereof, and the fall time of them varies in accordance with the level of the input signal Pin. The PWM signal +PA is supplied to a drive circuit 13, and the PWM signal +PB is supplied to an inverter 145 to be inverted to a PWM signal −PB, as shown in part B of FIG. 4. The PWM signal −PB is supplied to the drive circuit 13.

Drive voltages P1 and P2 are outputted from the drive circuit 13 and are supplied to a push-pull circuit 15. In this case, as shown in part C of FIG. 4, the drive voltage P1 is a signal obtained by alternately combining the PWM signals +PA and −PB every cycle time Tc. The drive voltage P2 is the inverted signal of the drive voltage P1.

In the power amplifier shown in FIG. 3, the push-pull circuit 15 uses positive and negative power supplies. The drain of the FET Q11 is connected to a positive power terminal TPWR+, while the source of the FET Q12 is connected to a negative power terminal TPWR−. A positive DC voltage +VDD and a negative DC voltage −VDD are supplied as power supply voltages to the power terminals TPWR+ and TPWR−, respectively. The output end of the push-pull circuit 15 is connected to one end of a speaker 19 through a low-pass filter 17. The other end of the speaker 19 is grounded.

Accordingly, the output voltage VA of the push-pull circuit 15 exhibits a waveform shown in part D of FIG. 4 in accordance with the drive voltages P1 and P2. As shown in part E of FIG. 4, a current i having a polarity and size in accordance with the input signal Pin flows through the speaker 19, thereby amplifying the power.

Also in this power amplifier, the numbers of rising edges and falling edges of the drive voltages P1 and P2 are ½ of the numbers of rising edges and falling edges of the PWM signals +PA and +PB. Thus, a short-through current flowing through the FETs Q11 and Q12 and the FETs Q13 and Q14 can be reduced by half. Since the frequency of the output voltage VA is ½ of the frequencies of the PWM signals +PA and +PB, the radiation caused by the output voltage VA is reduced.

Figure 5:
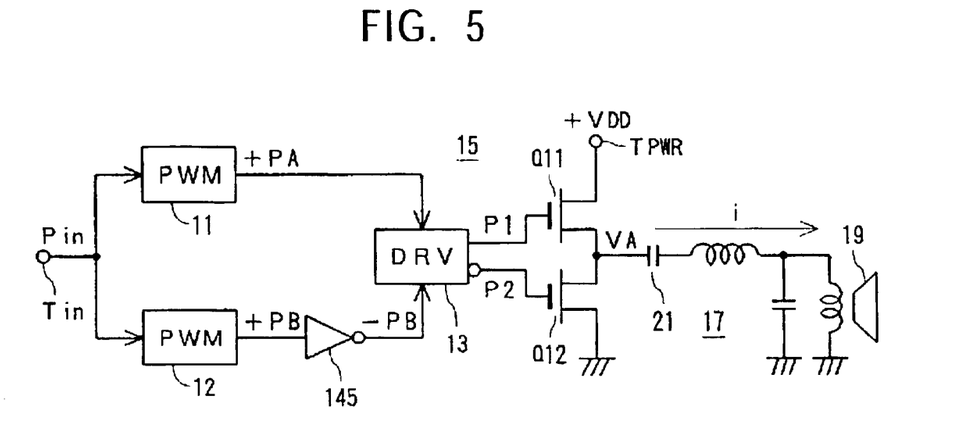
FIG. 5 is a circuit diagram of a power amplifier circuit according to still another embodiment of the present invention.

A power amplifier shown in FIG. 5 has a single circuit as an output stage, as in the power amplifier shown in FIG. 3, in which the power supply voltage of a push-pull circuit 15 includes only a DC voltage +VDD. Accordingly, in this circuit, an output voltage VA is outputted as a result of switching between the power supply voltage +VDD and a ground potential of 0, so that a capacitor 21 for blocking the DC component is arranged between the output end of the push-pull circuit 15 and a low-pass filter 17. The capacitor 21 may be arranged between the low-pass filter 17 and a speaker 19.

With reference to FIGS. 1, 3, and 5, each component is described as an individual component circuit for clarity. However, in the stages arranged upstream of the push-pull circuits 15 and 16, drive signals can be produced using a software processor such as DSP (Digital Signal Processor) or a microprocessor.

Although the case where the input signal Pin is a digital audio signal has been described above, the input signal Pin may be an analog audio signal. Also, the PWM signals +PA, +PB,—PA, and −PB may be PNM (Pulse Number Modulation) signals or the like. The PWM circuits 11 and 12 may include an up counter, a down counter, and a comparator circuit.

Although the case where the power amplifier serves as an amplifier for audio has been described above, the power amplifier can be used as an amplifier for driving electric power equipment such as a motor. If any load is connected in place of the speaker 19, the operating voltage can be supplied to the load, and changing the input signal Pin allows the voltage magnitude supplied to the load to be changed, so that the load can be used as a variable power circuit.

What is claimed is:

1. A power amplifier comprising:
   a first pulse modulation circuit for converting au input signal into a first pulse modulation signal indicating a level of the input signal and for outputting the first pulse modulation signal;
   a second pulse modulation circuit for converting said input signal into a second pulse modulation signal indicating a 2's complement of the level of the input signal and for outputting the second pulse modulation signal;
   a first output circuit and a second output circuit, each including a switching element;
   a first drive circuit for producing, from the output of said first pulse modulation circuit and the output of said second pulse modulation circuit, a first drive signal that drives the switching element of said first output circuit; and
   a second drive circuit for producing, from the output of said first pulse modulation circuit and the output of said second pulse modulation circuit, a second drive signal that drives the switching element of said second output circuit,
   wherein a load is connected between an output end of said first output circuit and an output end of said second output circuit,
   wherein said first drive circuit produces said first drive signal at odd-numbered periods of said first and second pulse modulation signals and produces an output value of zero at even-numbered periods of said first and second pulse modulation signals, and
   wherein said second drive circuit produces an output value of zero at odd-numbered periods of said first and second pulse modulation signals and produces said second drive signal at even-numbered periods of said first and second pulse modulation signals.

2. A power amplifier according to claim 1,
   wherein, in said first drive circuit, said first drive signal is a differential output between the output of said first pulse modulation circuit and the output of said second pulse modulation circuit at odd-numbered periods of said first and second pulse modulation signals, and has an output value of zero at even-numbered periods of said first and second pulse modulation signals, and
   wherein, in said second drive circuit, said second drive signal has an output value of zero at odd-numbered periods of said first and second pulse modulation signals, and is a differential output between the output of said second pulse modulation circuit and the output of said first pulse modulation circuit at even-numbered periods of said first and second pulse modulation signals.

3. A power amplifier according to claim 1, wherein, in said first drive circuit, said first drive signal is a differential output between the output of said first pulse modulation circuit and the output of said second pulse modulation circuit at odd-numbered periods of said first and second pulse modulation signals, and has art output value of zero at even-numbered periods of said first and second pulse modulation signals, and wherein, iii said second drive circuit, said second drive signal has an output value of zero at odd-numbered periods of said first and second pulse modulation signals, and is a differential output between the inverted signal of the output of said first pulse modulation circuit and the inverted signal of the output of said second pulse modulation circuit at even-numbered periods of said first and second pulse modulation signals.

4. A power amplifier according to claim 1, wherein, in said first drive circuit, said first drive signal is a result of an AND operation on the output of said first pulse modulation circuit and an inverted signal of the output of said second pulse modulation circuit, and wherein, in said second drive circuit, said second drive signal is a result of an AND operation on an inverted signal of the output of said first pulse modulation circuit and the output of said second pulse modulation circuit.

5. A power amplifier according to claim 1, wherein the first and the second pulse modulation signals are PWM signals.

6. A power amplifier comprising:

a first pulse modulation circuit for converting an input signal into a first pulse modulation signal indicating a level of the input signal and for outputting the first pulse modulation signal;

a second pulse modulation circuit for converting said input signal into a second pulse modulation signal indicating a 2's complement of the level of the input signal and for outputting the second pulse modulation signal;

an output circuit including a switching element; and a drive circuit for producing a pair of drive voltages, the levels of which are inverted with respect to one another, from the outputs of said first and second pulse modulation circuits to produce a drive signal that drives said switching element of said output circuit, wherein said drive circuit alternately outputs as the drive signal the output of said first pulse modulation circuit and an inverted signal of the output of said second pulse modulation circuit every cycle time of the pulse modulation signals.

7. A power amplifier according to claim 6, wherein the first and the second pulse modulation signals are PWM signals.

* * * * *